(12) United States Patent
Lian et al.

(10) Patent No.: US 7,319,270 B2
(45) Date of Patent: Jan. 15, 2008

(54) MULTI-LAYER ELECTRODE AND METHOD OF FORMING THE SAME

(75) Inventors: Jingyu Lian, Wallkill, NY (US); Chenting Lin, Poughkeepsie, NY (US); Nicolas Nagel, Yokohama (JP); Michael Wise, Lagrangeville, NY (US)

(73) Assignee: Infineon Technologies AG, Munich (DE)

( * ) Notice: Subject to any disclaimer, the term of this patent is extended or adjusted under 35 U.S.C. 154(b) by 138 days.

(21) Appl. No.: 10/929,157

(22) Filed: Aug. 30, 2004

(65) Prior Publication Data

US 2005/0023590 A1 Feb. 3, 2005

Related U.S. Application Data

(63) Continuation of application No. 09/751,551, filed on Dec. 28, 2000, now Pat. No. 6,794,705.

(51) Int. Cl.
  H01L 23/48 (2006.01)
  H01L 23/52 (2006.01)
  H01L 29/40 (2006.01)
  H01L 27/10 (2006.01)
  H01L 29/74 (2006.01)

(52) U.S. Cl. .................. 257/758; 257/207; 257/208; 257/211; 257/700; 257/750; 257/751; 257/759; 257/760; 257/761; 257/769; 257/774

(58) Field of Classification Search ........ 257/750–751, 257/758, 761, 769, 774, 207–208, 211, 700, 257/759–760
See application file for complete search history.

(56) References Cited

U.S. PATENT DOCUMENTS

| | | | |
|---|---|---|---|
| 3,699,409 A | 10/1972 | Feuersanger et al. | |
| 4,840,302 A * | 6/1989 | Gardner et al. | 228/123.1 |
| 5,005,102 A | 4/1991 | Larson | |
| 5,122,923 A | 6/1992 | Matsubara et al. | |
| 5,189,503 A | 2/1993 | Suguro et al. | |
| 5,341,026 A * | 8/1994 | Harada et al. | 257/764 |
| 5,442,213 A | 8/1995 | Okudaira et al. | |
| 5,459,353 A * | 10/1995 | Kanazawa | 257/751 |
| 5,525,837 A * | 6/1996 | Choudhury | 257/751 |
| 5,534,731 A * | 7/1996 | Cheung | 257/759 |
| 5,555,486 A | 9/1996 | Kingon et al. | |
| 5,561,307 A | 10/1996 | Mihara et al. | |

(Continued)

FOREIGN PATENT DOCUMENTS

EP 0 609 081 B1 8/1994

(Continued)

OTHER PUBLICATIONS

Kotecki, D.E., et al., "(Ba,Sr) TiO$_3$ Dielectrics for Future Stacked-Capacitor DRAM," IBM J. Res. Develop., vol. 43, No. 3 (May 1999) pp. 367-382.

Primary Examiner—Ida M. Soward
(74) Attorney, Agent, or Firm—Slater & Matsil, L.L.P.

(57) ABSTRACT

An interconnect includes an opening formed in a dielectric layer. A conductive barrier is deposited in the opening, over which a first conductive layer is deposited. A conductive oxide is deposited over the first conductive layer, and a second conductive layer, formed from the same material as the first conductive layer, is deposited over the conductive liner.

26 Claims, 6 Drawing Sheets

U.S. PATENT DOCUMENTS

| | | | |
|---|---|---|---|
| 5,627,403 A * | 5/1997 | Bacchetta et al. | 257/639 |
| 5,708,284 A | 1/1998 | Onishi | |
| 5,717,236 A | 2/1998 | Shinkawata | |
| 5,824,590 A | 10/1998 | New | |
| 5,838,035 A | 11/1998 | Ramesh | |
| 5,905,278 A | 5/1999 | Nakabayashi | |
| 6,168,991 B1 | 1/2001 | Choi et al. | |
| 6,229,211 B1 * | 5/2001 | Kawanoue et al. | 257/751 |
| 6,239,021 B1 * | 5/2001 | Pramanick et al. | 438/627 |
| 6,265,260 B1 | 7/2001 | Alers et al. | |
| 6,297,086 B1 * | 10/2001 | Hegde et al. | 438/243 |
| 6,297,527 B1 | 10/2001 | Agarwal et al. | |
| 6,313,539 B1 | 11/2001 | Yokoyama et al. | |
| 6,316,802 B1 | 11/2001 | Schindler et al. | |
| 6,350,685 B1 * | 2/2002 | Asahina et al. | 438/660 |
| 6,355,558 B1 * | 3/2002 | Dixit et al. | 438/642 |
| 6,391,769 B1 * | 5/2002 | Lee et al. | 438/643 |
| 6,433,429 B1 * | 8/2002 | Stamper | 257/751 |
| 6,436,825 B1 * | 8/2002 | Shue | 438/687 |
| 6,462,931 B1 | 10/2002 | Tang et al. | |
| 6,465,828 B2 * | 10/2002 | Agarwal | 257/296 |
| 6,485,988 B2 * | 11/2002 | Ma et al. | 438/3 |
| 6,617,634 B2 | 9/2003 | Marsh et al. | |
| 6,635,528 B2 * | 10/2003 | Gilbert et al. | 438/253 |
| 6,750,500 B1 * | 6/2004 | Agarwal | 257/310 |
| 2001/0050435 A1 * | 12/2001 | Li | 257/751 |
| 2002/0000665 A1 * | 1/2002 | Barr et al. | 257/758 |
| 2003/0129826 A1 * | 7/2003 | Werkhoven et al. | 438/627 |

FOREIGN PATENT DOCUMENTS

| | | |
|---|---|---|
| EP | 1 054 440 A2 | 11/2000 |
| GB | 2 345 793 A | 7/2000 |
| JP | 10-242078 | 9/1998 |
| WO | WO 98/31053 | 7/1998 |
| WO | WO 00/39842 | 7/2000 |

* cited by examiner

US 7,319,270 B2

MULTI-LAYER ELECTRODE AND METHOD OF FORMING THE SAME

This application is a continuation of patent application Ser. No. 09/751,551, entitled "Multi-Layer PT Electrode for DRAM and FRAM with High K Dielectric Materials," filed on Dec. 28, 2000 now U.S. Pat. No. 6,794,705, which application is incorporated herein by reference.

TECHNICAL FIELD

The present invention relates generally to the fabrication of integrated circuits (IC's), and more particularly to the fabrication of memory IC's.

BACKGROUND OF THE INVENTION

Semiconductor devices are used in a variety of electronic applications, such as personal computers and cellular phones, for example. One such semiconductor product widely used in electronic systems for storing data is a semiconductor memory, and one common type of semiconductor is a dynamic random access memory (DRAM). A DRAM typically includes millions or billions of individual DRAM cells, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation.

Another memory semiconductor device is called a ferroelectric random access memory (FRAM). An FRAM typically has a similar structure to a DRAM but is comprised of materials such that the storage capacitor does not need to be refreshed continuously as in a DRAM. Common applications for FRAM's include cellular phones and digital cameras, for example.

The semiconductor industry in general is being driven to decrease the size of semiconductor devices located on integrated circuits. Miniaturization is generally needed to accommodate the increasing density of circuits necessary for today's semiconductor products. A challenge in producing memory devices such as DRAM's and FRAM's is maintaining the minimum amount of charge that must be stored in a storage capacitor to obtain reliable operation of the memory device. One way to increase the capacitance density of memory devices is to use higher permittivity capacitance dielectric materials such as barium-strontium titanate (Ba, Sr)TiO$_3$ (BSTO).

Shown in FIG. 1 is a cross-sectional view of a prior art DRAM stacked capacitor structure, with a storage capacitor 18 above a bit line contact 16 and connecting to underlying devices through polysilicon plugs 17. The capacitor structure 18 is built upon a substrate 12 which typically comprises polysilicon and may also include underlying semiconductor layers and structures. Word line 14 and bit line 16 provide an address array to enable the programming or charging, or reading of the capacitor 18 during use. Cell plate 28 overlies the high dielectric constant (k) material 26 which may comprise BSTO, for example. Bottom electrode 24 comprises platinum (Pt) overlying a conductive barrier layer 22. Pt is typically used because of its superior work function. The barrier layer 22 comprises a conductive material and is used to separate the electrode 24 from the plug material 20 to prevent electrode-plug interdiffusion and reaction. Barrier layer 22 also protects the plug 17 against oxygen exposure during the deposition of the BSTO dielectric 26, which typically occurs in a high temperature oxygen environment at temperatures in the range of 450 to 700° C. The high dielectric constant material 26 conformally coats the bottom electrode 24, and the counter-electrode forms a plate 28 that is common to an array of a plurality of capacitors 18.

A problem with the stacked capacitor structure 18 using a high dielectric constant material 26 shown in FIG. 1 is that upon deposition of the high dielectric constant material 26, oxygen diffuses through the platinum of electrode 24 to barrier layer 22, forming an oxide layer 30 between bottom electrode 24 and conductive barrier layer 22. Oxide layer 30 comprises an interfacial low dielectric layer between electrode 24 and barrier layer 22 and is typically about 15 nm thick.

The formation of oxide layer 30 is problematic because the bottom electrode is required to be conductive. Oxide 30 typically comprises a non-conductive oxide such as such as TaSiN$_x$O$_y$, creating an open in the bottom electrode 24, or increasing the resistance of the bottom electrode 24. A similar oxide barrier layer may also form between Pt 24 and plug 17 during BSTO deposition if no barrier layer 22 is used.

What is needed in the art is a memory cell bottom electrode design and method of fabrication thereof that prevents the formation of a non-conductive oxide 30 within the bottom electrode.

In Japanese Patent No. 10-242078 entitled "Multi-Layer Electrode Using Conductive Oxide," issued to Sharp Corporation and published on Sep. 11, 1998, a multi-layer electrode is proposed, in which a conductive barrier layer 122 is formed, and a layer of Iridium (Ir) 132 is deposited over barrier layer 122, as shown in FIG. 2. A relatively thick layer of Iridium oxide (IrO$_2$) 134 is deposited over the Ir layer 132, as shown in FIG. 2. Pt electrode material 124 is deposited over the IrO$_2$ layer 134.

While the Ir layer 132 and IrO$_2$ layer 134 are conductive and inhibit oxygen diffusion to the poly silicon underneath the barrier liner 122, the structure shown in FIG. 2 is disadvantageous because the excessive thicknesses of the Ir layer 132 and IrO$_2$ layer 134 do not permit the use of the same etchant gas as used to process the Pt material 124, for example. Therefore, several different etchant gases are required to pattern the electrode, requiring increased labor, time, and an increase in the number and variety of processing chemicals.

SUMMARY OF THE INVENTION

The present invention achieves technical advantages as a multi-layer platinum electrode for use in memory devices having high dielectric constant materials. A multi-layer electrode stack having a thin conductive oxide layer to control the electrode texture prevents oxygen diffusion through the electrode. The thin conductive oxide layer is etchable with the same gases used to etch the conductive electrode materials.

Disclosed is a multi-layer electrode for an integrated circuit, including a conductive barrier layer, a first conductive liner deposited over the conductive barrier layer, a second conductive liner deposited over the first conductive liner, and a conductive layer deposited over the second conductive liner, where the conductive layer and the first conductive liner comprise the same material.

Also disclosed is a multi-layer electrode for an integrated circuit, comprising a conductive barrier layer, a first conductive liner deposited over the conductive barrier layer, a second conductive liner comprising a conductive oxide deposited over the first conductive liner, and a conductive layer deposited over the second conductive liner.

Further disclosed is a method of fabricating an electrode of an integrated circuit, comprising depositing a conductive barrier layer over a substrate, depositing a first conductive liner over the conductive barrier layer, depositing a second conductive liner over the first conductive liner, and depositing a conductive layer over the second conductive liner, where the conductive layer and the first conductive liner comprise the same material.

Advantages of the invention include prohibiting oxygen diffusion through the multi-layer electrode to the barrier layer interface, preventing the formation of an oxide layer which can cause an open and increase the resistance of the electrode. Material variation is reduced during electrode patterning, for example, the same etchant gas may be used to pattern the conductive layer of the electrode and the first and second conductive liners. The method and structure described herein may be used and applied to a variety of memory integrated circuits, such as DRAM's and FRAM's. The columnar grain growth of Pt is stopped by the insertion of the conductive oxide layer between two Pt layers in accordance with the present invention.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

A description of preferred embodiments of the present invention will be discussed, followed by a comparison of prior art electrode molecular grain structures with the present invention molecular structure, and a discussion of some advantages of the invention. Only one electrode is shown in each figure, although many electrodes and other components of a memory cell are present in the semiconductor devices shown.

Figure 3:
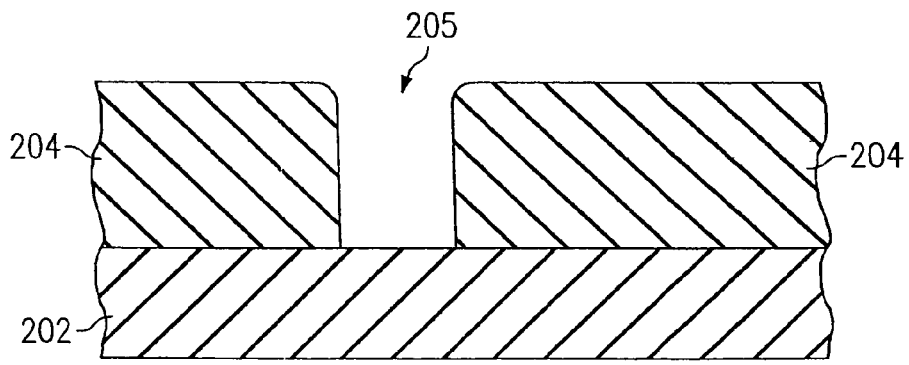
FIGS. 3-10 show cross-sectional views of a multi-layer electrode for a memory cell in accordance with the preferred embodiment of the present invention at various stages of fabrication.

FIGS. 3-14 show two preferred embodiments of the present multi-layer memory electrode invention in various stages of fabrication. FIG. 3 shows a cross-sectional view of a semiconductor memory device having a workpiece 202. Workpiece 202 preferably comprises a semiconductor substrate such as silicon. Alternatively, other circuit components may reside within workpiece 202, although the top surface of the workpiece 202 preferably comprises an oxide such as silicon dioxide, for example. In accordance with the present invention, an insulating layer 204 is deposited over workpiece 202. Insulating layer 204 preferably comprises silicon dioxide ($SiO_2$), and may alternatively comprise other dielectric materials. Insulating layer 204 is patterned and etched to form trenches 205, as shown. Trenches 205 represent areas where conductive vias will be formed in subsequent processing steps.

Figure 1:
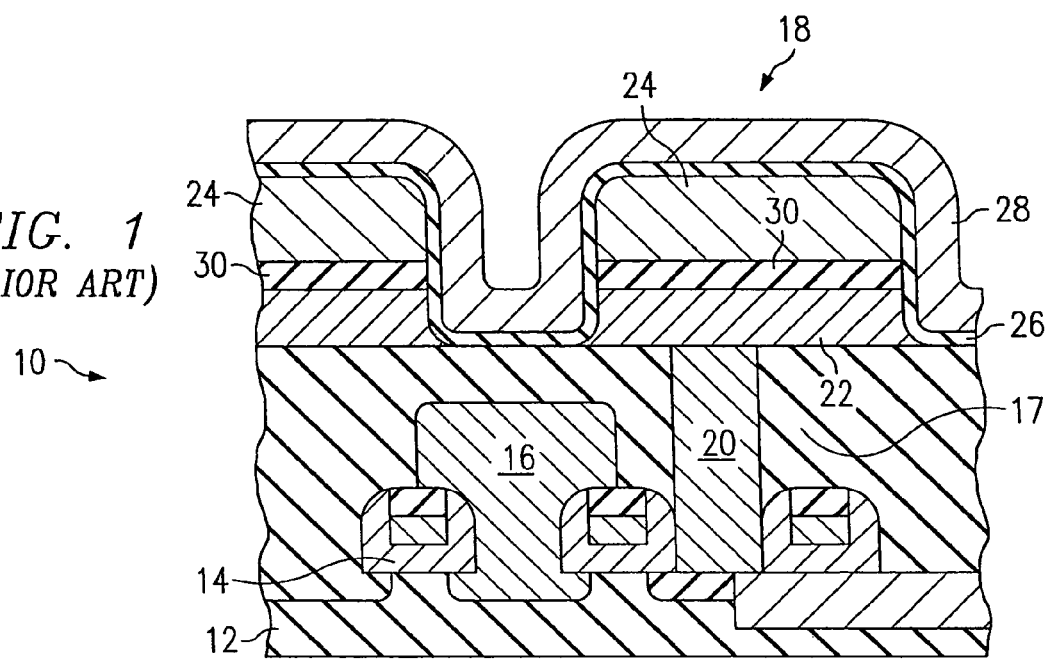
FIG. 1 illustrates a cross-sectional view of a prior art DRAM stacked capacitor having a non-conductive oxide layer formed between the barrier layer and the bottom electrode.
Figure 2:
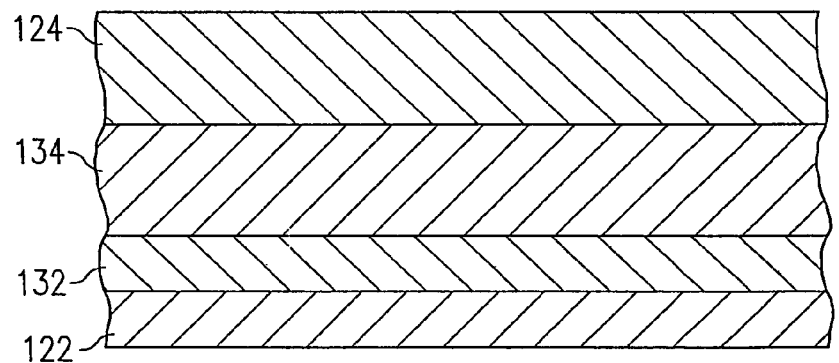
FIG. 2 illustrates a cross-sectional diagram of a prior art multi-layer bottom electrode.
Figure 4:
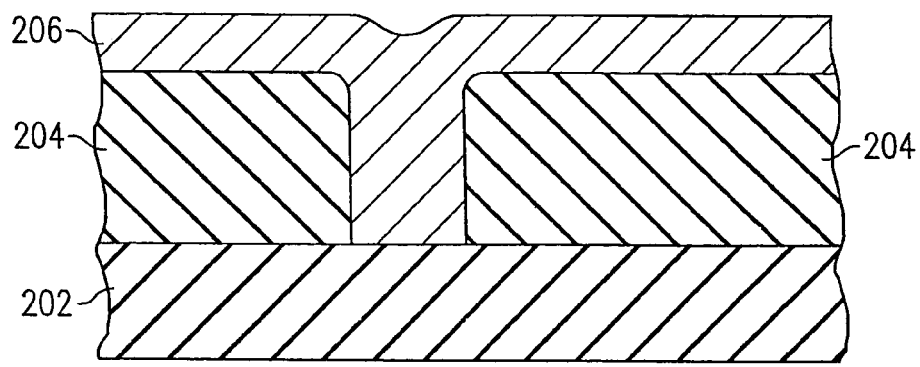

A layer of conductive material 206 is deposited over the insulating layer 204 and exposed portions of the substrate 202 to fill trench 205, as shown in FIG. 4. Conductive layer 206 preferably comprises poly-crystalline silicon (polysilicon), and may comprise other conductive materials suitable to electrically couple the bottom electrode to a word or bit line contact beneath the structure shown (similar to the structure shown in FIG. 1).

Figure 5:
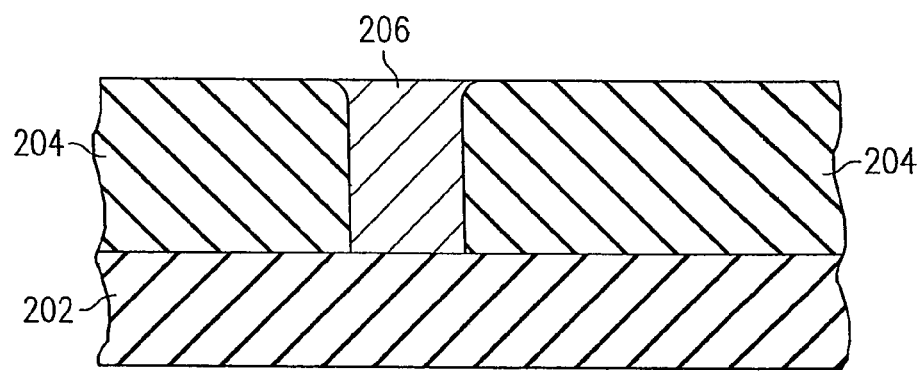

The wafer is exposed to a chemical-mechanical polish (CMP) to expose insulating layer 204, as shown in FIG. 5.

Next, two processes to form the bottom electrode structure will be described. The first process forms a recessed structure, which process flow is shown in FIGS. 6-10, and the second process forms a non-recessed structure, which process flow is shown in FIGS. 11-15.

Figure 6:
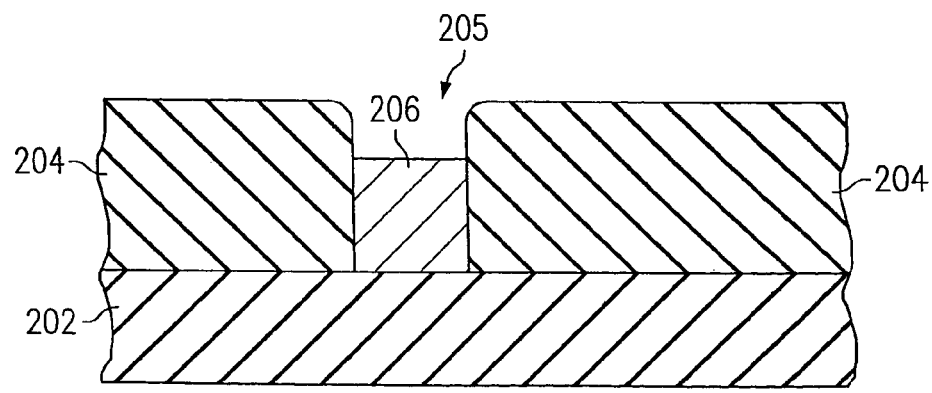
Figure 7:
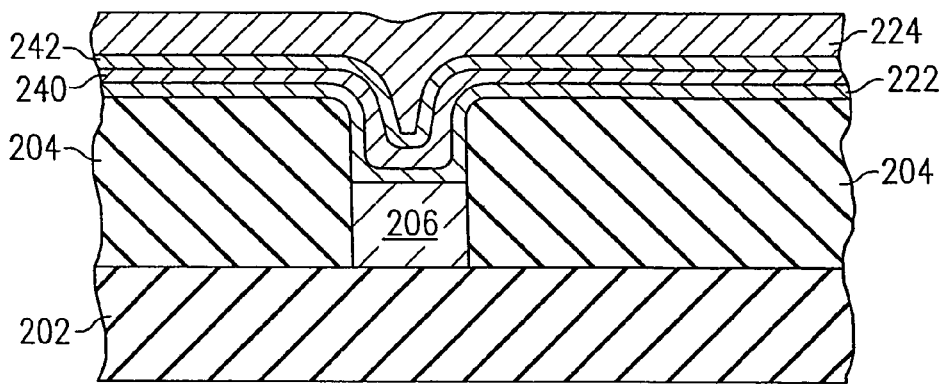

For the recessed structure process, the conductive material 206 is etched to remove a portion of the polysilicon from the top of the trench 205 and leave a recess, shown in FIG. 6. Three liners 222, 240, 242 and a conductive layer 224 are deposited with an in situ deposition, shown in FIG. 7. A conductive barrier layer 222 is deposited over insulating layer 204 and polysilicon material 206 in the trench. Conductive barrier layer 222 preferably comprises TaSiN, for example, and may alternatively comprise other conductive materials. Preferably, conductive barrier layer 222 comprises 15-500 Angstroms of TaSiN, and more preferably comprises 100-300 Angstroms of TaSiN.

A first conductive liner 240 is deposited over conductive barrier layer 222. First conductive liner 240 preferably comprises Pt, and may alternatively comprise other conductive materials such as Ir, Ru, Pd or combinations thereof, for example. First conductive liner 240 preferably comprises the same material as the material to be subsequently deposited for conductive layer 224. Preferably, the first conductive liner 240 comprises 100-500 Angstroms of Pt, and more preferably comprises 200 Angstroms of Pt.

A second conductive liner 242 is deposited over the first conductive liner 240. Second conductive liner 242 preferably comprises a conductive oxide such as Iridium oxide ($IrO_2$), or alternatively, Ruthenium oxide ($RuO_2$), for example. Preferably, the second conductive liner 242 comprises 20-500 Angstroms of conductive oxide, and more preferably comprises 20-50 Angstroms of conductive oxide.

A layer of conductive material 224 is deposited over the second conductive liner 242. Conductive layer 224 preferably comprises Pt, and may alternatively comprise other conductive materials such as Ir, Ru, Pd or combinations thereof, for example. Preferably, conductive material 224 comprises 1500-3500 Angstroms of Pt, and more preferably comprises 2200 Angstroms of Pt.

Figure 8:
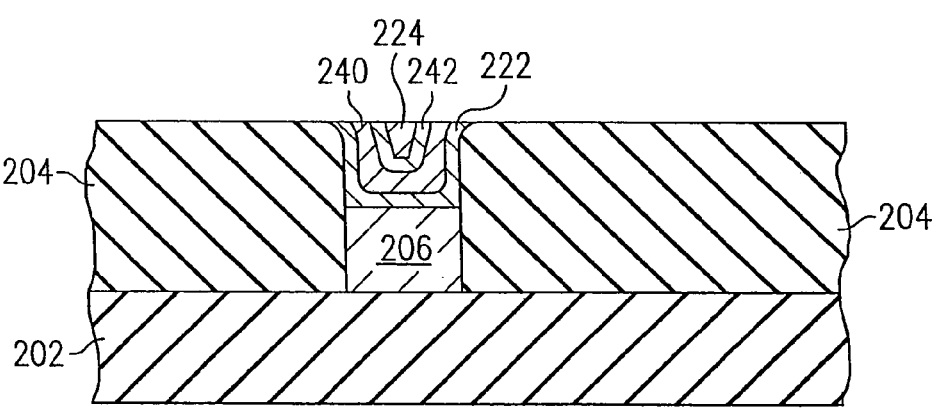

The wafer is exposed to a CMP process to expose insulating layer 204 around the multi-layer electrode, as shown in FIG. 8. Because the second conductive liner 242 is thin, the conductive layer 224 can be deposited filling into the recess. The interface between the conductive layer 224 and the second conductive liner 242 will not be exposed during the CMP. This will prevent the surface of second conductive liner 242 from the contamination and therefore increase the adhesion of the conductive layer 224 on the second conductive liner 242.

Figure 9:
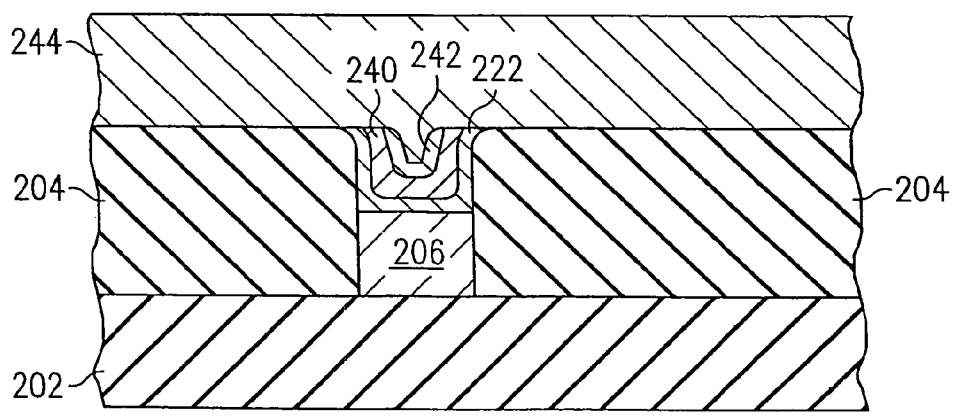

Conductive layer 244 is deposited, as shown in FIG. 9. Preferably, conductive layer 244 comprises Pt and alternatively may comprise other conductive materials such as Ir, Ru, Pd or combinations thereof, for example. Layer 244 and 224 preferably comprise the same material and are essentially homogenous, and thus, they are shown as one layer 244 in subsequent figures.

Figure 10:
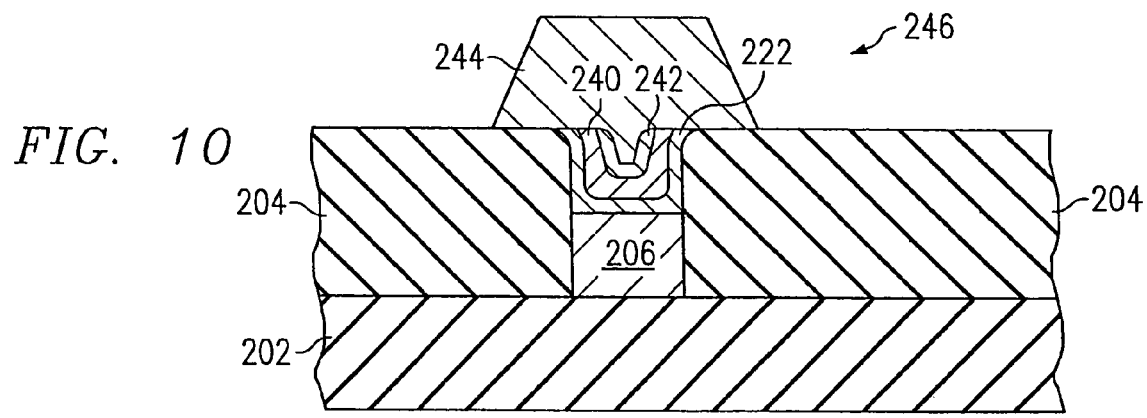

The conductive material 244 is patterned and etched to form a conductive region 244, as shown in FIG. 10.

Figure 11:
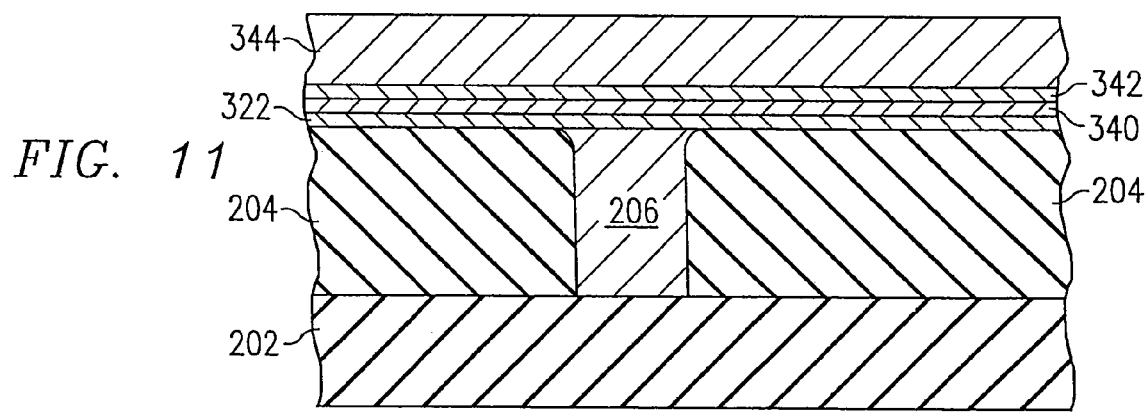
FIGS. 11-15 show cross-sectional views of an alternate process flow for the process shown in FIGS. 6-10.

In a second embodiment, which comprises a process for fabricating a non-recessed bottom electrode structure, four conductive layers, 322, 340, 342, and 344 are deposited on planarized polysilicon 206 and silicon oxide 204, shown in FIG. 11. A conductive barrier layer 222 is deposited over planarized conductive material 206 and insulating layer 204. Conductive barrier layer 322 preferably comprises TaSiN, for example, and may alternatively comprise other conductive materials. Preferably, conductive barrier layer 322 comprises 15-500 Angstroms of TaSiN, and more preferably comprises 100-300 Angstroms of TaSiN.

A first conductive liner 340 is deposited over conductive barrier layer 322. First conductive liner 340 preferably comprises Pt, and may alternatively comprise other conductive materials such as Ir, Ru, Pd or combinations thereof, for example. First conductive liner 340 preferably comprises the same material as the material to be subsequently deposited for conductive layer 324. Preferably, the first conductive liner 340 comprises 100-500 Angstroms of Pt, and more preferably comprises 200 Angstroms of Pt.

A second conductive liner 342 is deposited over the first conductive liner 340. Second conductive liner 342 preferably comprises a conductive oxide such as $IrO_2$, or alternatively, $RuO_2$, for example. Preferably, the second conductive liner 342 comprises 20-500 Angstroms of conductive oxide, and more preferably comprises 20-50 Angstroms of conductive oxide.

A layer of conductive material 324 is deposited over the second conductive liner 342. Conductive layer 324 preferably comprises Pt, and may alternatively comprise other conductive materials such as Ir, Ru, Pd or combinations thereof, for example. Preferably, conductive material 324 comprises 1500-3500 Angstroms of Pt, and more preferably comprises 2200 Angstroms of Pt.

Figure 12:
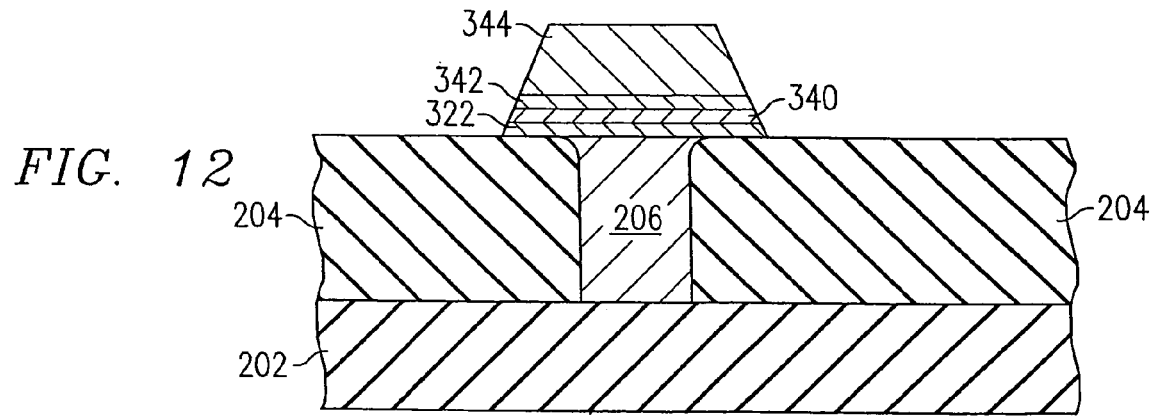

The four conductive four conductive layers, 322, 340, 342, and 344 are patterned, for example, by RIE, as shown in FIG. 12. Because the second conductive liner 342 is thin, the same etchant gas may be used to etch second conductive layer 342 as used to etch conductive materials 344 and 340.

Figure 13:
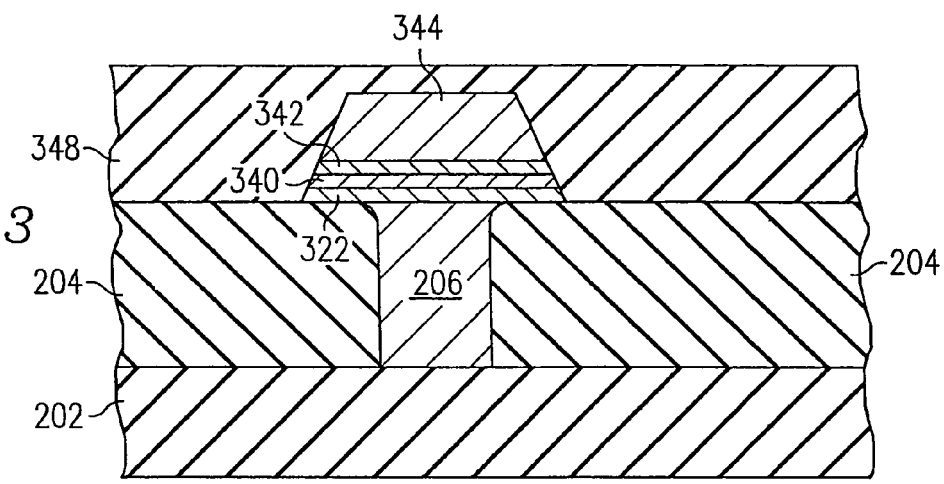
Figure 14:
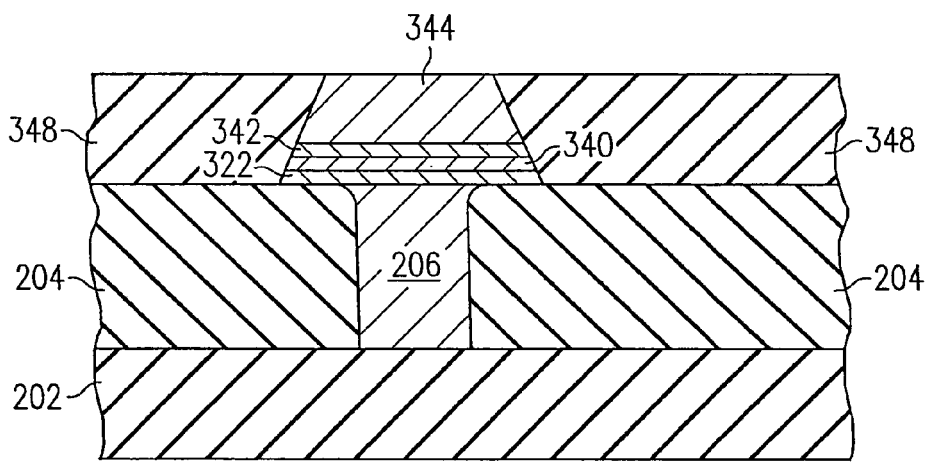
Figure 15:
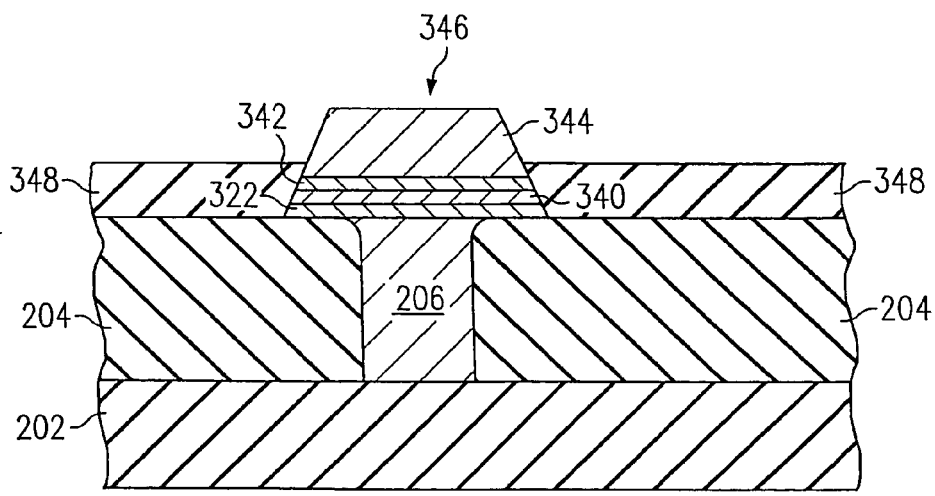

An insulator layer 348 comprising a dielectric such as $SiO_2$, is deposited on the patterned conductive layers 322, 340, 342, and 344, as shown in FIG. 13. The wafer is planarized, for example, by CMP, shown in FIG. 14 and the insulator layer 348 is etched back to a height such that insulator layer 348 will cover the interface of conductive layer 344 and second conductive layer 342, as shown in FIG. 15.

Barrier layer 222/322, first conductive liner 240/340, second conductive layer liner 242/340, and conductive region 244/344 comprise a multi-layer electrode 246/346 stack in accordance with the present invention. The thin second conductive stack liner 242/342 controls the electrode conductive layer 244/344 texture, preventing oxygen diffusion through to the barrier layer 222/322.

Figure 16:
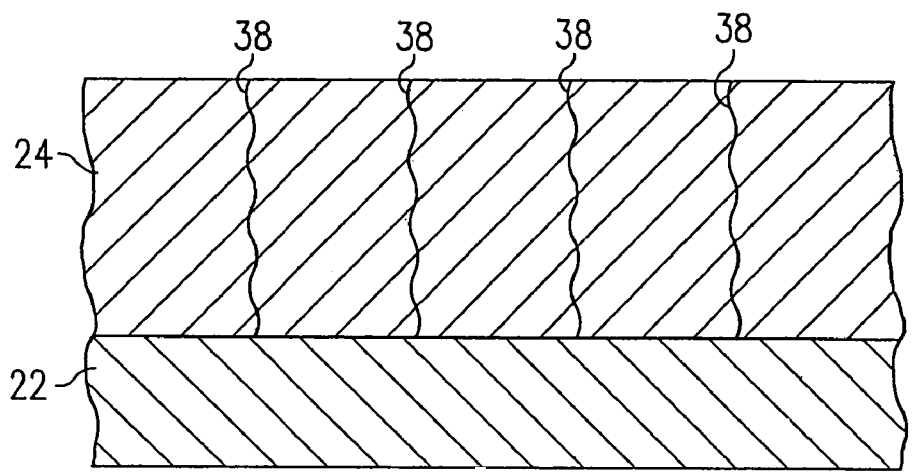
FIG. 16 illustrates a prior art grain structure of a bottom electrode.

The differences in the grain structure on a molecular level between the prior art and the present invention will next be described. FIG. 16 illustrates a cross-sectional view of a prior art Pt electrode 24 overlying a barrier layer 22. When Pt 24 is deposited using a physical vapor deposition (PVD) as is commonly done in the industry, the Pt has a columnar grain structure, as shown. Columns 38 permit diffusion of oxygen through the grain boundary of Pt 24 to barrier layer 22, which can form an oxide layer and create an open or increase the resistance of the electrode.

Figure 17:
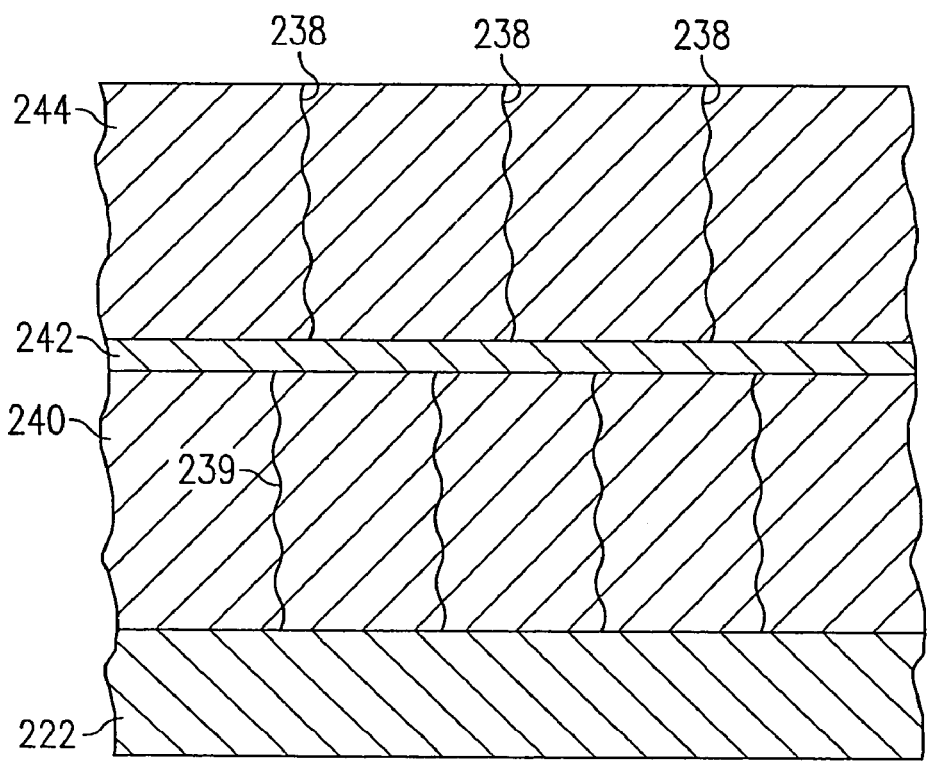
FIG. 17 illustrates a cross-sectional view of the grain structure of the electrode of the present invention.

FIG. 17 shows the molecular grain structure of the present invention having a conductive oxide layer 242 sandwiched between two Pt layers 244 and 240. The columns 238 of the top Pt layer 244 do not coincide with the columns 239 of the lower Pt 240 layer, reducing oxygen diffusion from the top surface to the barrier layer 222. The disconnected grain structure provided by the thin layer of conductive oxide 242 prevents the formation of a non-conductive oxide between the conductive layer 244 and barrier layer 222.

The present multi-layer electrode invention provides several advantages over prior art electrodes for memory semiconductors. The multi-layer electrode 246/346 of the present invention prohibits oxygen diffusion through the electrode to the barrier layer 222/322 interface, preventing the formation of an oxide layer which can cause opens in and increase the resistance of the electrode 246/346. Material variation is reduced during the electrode patterning, resulting in the same etchant gas being able to be used to pattern the Pt electrode conductive layer 244/344 and the first and second conductive liners 240/340 and 242/342. The method and structure described herein may be used and applied to a variety of structures, such as DRAM's, FRAM's, and other integrated circuit applications where oxygen diffusion is undesired, for example. The columnar grain growth of Pt is stopped by the insertion of the thin conductive oxide layer 242/342 between the two Pt layers 222/342 and 244/344 in accordance with the present invention.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. For example, while the multi-layer electrode invention is described herein with reference to a DRAM, it also has useful application in FRAM and other semiconductor devices. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An interconnect comprising:
   an opening formed in a dielectric layer;
   a conductive barrier layer deposited in the opening;
   a first conductive layer deposited over the conductive barrier layer;

a conductive liner deposited over the first conductive layer, wherein the conductive liner comprises a conductive oxide; and a second conductive layer deposited over the conductive liner, the first conductive layer and the second conductive layer comprising the same material and wherein the second conductive layer extends below a major surface of the dielectric layer.

2. The interconnect according to claim 1, wherein the conductive liner comprises iridium oxide.

3. The interconnect according to claim 1, wherein the conductive liner comprises ruthenium oxide.

4. The interconnect according to claim 1, wherein the conductive liner is 20-50 Angstroms thick.

5. The interconnect according to claim 1, wherein the first conductive layer is about 200-500 Angstroms thick.

6. The interconnect according to claim 1, wherein the conductive barrier layer comprises TaSiN.

7. The interconnect according to claim 1, wherein the first conductive layer and the second conductive layer comprise Platinum (Pt), Iridium (Ir), Ruthenium (Ru), or Palladium (Pd).

8. The interconnect according to claim 1, wherein the conductive barrier layer is formed over polysilicon formed in the opening.

9. A capacitor comprising:
a TaSiN layer;
a first Pt layer overlying the TaSiN layer;
a conductive liner overlying the first Pt layer, the conductive liner comprising a material selected from the group consisting of $IrO_2$ and $RuO_2$;
a second Pt layer overlying the conductive liner;
a dielectric liner overlying the second Pt layer; and
a conductive electrode overlying the dielectric liner.

10. The capacitor of claim 9, wherein the capacitor comprises a capacitor of a DRAM cell.

11. The capacitor of claim 9, wherein the conductive liner is 20-50 Angstroms thick and the first Pt layer is about 200-500 Angstroms thick.

12. An interconnect structure comprising:
a dielectric layer having an opening formed therein;
a barrier liner formed along a surface of the opening;
a multi-layer conductive layer formed over the barrier liner, the multi-layer conductive layer comprising a conductive liner formed between a first conductive layer and a second conductive layer, the first conductive layer and the second conductive layer comprising a first material, wherein the first material comprises Platinum (Pt), Iridium (Ir), Ruthenium (Ru), or Palladium (Pd).

13. The interconnect according to claim 12, wherein the conductive liner is 20-50 Angstroms thick.

14. The interconnect according to claim 12, wherein the first conductive layer is about 200-500 Angstroms thick.

15. The interconnect according to claim 12, wherein the barrier liner comprises TaSiN.

16. The interconnect according to claim 12, wherein the conductive liner comprises a conductive oxide.

17. The interconnect according to claim 12, wherein the conductive liner comprises iridium oxide.

18. The interconnect of claim 12, wherein the conductive liner comprises ruthenium oxide.

19. An interconnect comprising:
an opening formed in a dielectric layer;
a conductive barrier layer deposited over the opening, wherein the conductive barrier layer is formed over polysilicon formed in the opening;
a first conductive layer deposited over the conductive barrier layer;
a conductive liner deposited over the first conductive layer; and
a second conductive layer deposited over the conductive liner, the first conductive layer and the second conductive layer comprising the same material and wherein the second conductive layer extends below a major surface of the dielectric layer, and wherein the grain structure of the first and second conductive layers are interrupted by the conductive liner.

20. The interconnect according to claim 19, wherein the conductive liner comprises a conductive oxide.

21. The interconnect according to claim 20, wherein the conductive liner comprises iridium oxide.

22. The interconnect according to claim 20, wherein the conductive liner comprises ruthenium oxide.

23. The interconnect according to claim 20, wherein the conductive liner is 20-50 Angstroms thick.

24. The interconnect according to claim 19, wherein the first conductive layer is about 200-500 Angstroms thick.

25. The interconnect according to claim 19, wherein the conductive barrier layer comprises TaSiN.

26. The interconnect according to claim 19, wherein the first conductive layer and the second conductive layer comprise Platinum (Pt), Iridium (Ir), Ruthenium (Ru), or Palladium (Pd).

* * * * *